US010188019B2

United States Patent
Hwang et al.

(10) Patent No.: US 10,188,019 B2
(45) Date of Patent: Jan. 22, 2019

(54) ELECTRIC SHOCK PROTECTION CONTACTOR AND PORTABLE ELECTRONIC DEVICE INCLUDING THE SAME

(71) Applicant: AMOTECH CO., LTD, Incheon (KR)

(72) Inventors: Yoon-Ho Hwang, Seoul (KR); Byung Guk Lim, Incheon (KR); Yun Suk Choi, Incheon (KR)

(73) Assignee: AMOTECH CO., LTD., Incheon (KR)

( * ) Notice: Subject to any disclaimer, the term of this patent is extended or adjusted under 35 U.S.C. 154(b) by 382 days.

(21) Appl. No.: 14/885,549

(22) Filed: Oct. 16, 2015

(65) Prior Publication Data

US 2017/0005464 A1    Jan. 5, 2017

(30) Foreign Application Priority Data

Jul. 1, 2015 (KR) ........................ 10-2015-0094280

(51) Int. Cl.
| | |
|---|---|
| *H02H 9/02* | (2006.01) |
| *H05K 9/00* | (2006.01) |
| *H01R 13/24* | (2006.01) |
| *H01C 7/12* | (2006.01) |
| *H01R 13/66* | (2006.01) |

(52) U.S. Cl.
CPC ............ *H05K 9/0067* (2013.01); *H01C 7/12* (2013.01); *H01R 13/2414* (2013.01); *H01R 13/2442* (2013.01); *H01R 13/6666* (2013.01)

(58) Field of Classification Search
CPC ........................................................ H02H 9/02
See application file for complete search history.

(56) References Cited

U.S. PATENT DOCUMENTS

| | | | | |
|---|---|---|---|---|
| 4,811,164 A | * | 3/1989 | Ling | ................ H01G 4/40 |
| | | | | 156/89.14 |
| 5,115,221 A | * | 5/1992 | Cowman | ............. H01C 7/10 |
| | | | | 338/21 |
| 2008/0100519 A1 | * | 5/2008 | Ku | .................. H01Q 1/243 |
| | | | | 343/702 |
| 2010/0254052 A1 | * | 10/2010 | Katsumura | ........... H01T 1/24 |
| | | | | 361/56 |
| 2011/0222203 A1 | * | 9/2011 | Adachi | ................ H01T 1/20 |
| | | | | 361/220 |
| 2012/0138354 A1 | * | 6/2012 | Lin | .................. H05K 9/0015 |
| | | | | 174/358 |

(Continued)

FOREIGN PATENT DOCUMENTS

| | | |
|---|---|---|
| JP | 2643193 B | 5/1997 |
| JP | 2586321 Y2 | 12/1998 |
| KR | 10-2005-0055382 A | 6/2005 |

(Continued)

*Primary Examiner* — Scott Bauer
(74) *Attorney, Agent, or Firm* — Seed IP Law Group LLP

(57) ABSTRACT

Provided are an electric shock protection contactor and a portable electronic device including the same. The electric shock protection contactor according to an exemplary embodiment of the present invention includes a conductive connection unit electrically in contact with a conductor of an electronic device and an electric shock protection element connected to the conductive connection unit in series and blocking a leakage current of an external power source that is introduced from the ground of a circuit board of the electronic device.

27 Claims, 13 Drawing Sheets

(56) References Cited

U.S. PATENT DOCUMENTS

2013/0057994 A1* 3/2013 Youn ...................... H02H 9/00
361/56

FOREIGN PATENT DOCUMENTS

| KR | 10-2007-0109332 A | 11/2007 |
| KR | 10-2008-0044551 A | 5/2008 |
| KR | 2020080001363 U | 5/2008 |
| KR | 10-2008-0067917 A | 7/2008 |
| KR | 10-2013-0128543 A | 11/2013 |

* cited by examiner

ELECTRIC SHOCK PROTECTION CONTACTOR AND PORTABLE ELECTRONIC DEVICE INCLUDING THE SAME

CROSS-REFERENCE TO RELATED APPLICATIONS

The entire contents of Korean Patent Application No. 10-2015-0094280, filed on Jul. 1, 2015, are hereby incorporated by reference.

BACKGROUND OF THE INVENTION

The present invention disclosed herein relates to an electric shock protection contactor and a portable electronic device including the same, and more particularly, to an electric shock protection contactor capable of protecting a user from a leakage current from a power source and a portable electronic device including the same.

In line with miniaturization and multifunctional operation of recent portable electronic devices, various components and elements are densely arranged in the portable electronic devices. Thus, in order to reduce impact from the outside as well as electromagnetic waves penetrating into the portable electronic device or leaked from the portable electronic device, a conductive gasket is used between an external housing and a built-in circuit board of the portable electronic device.

Also, due to the multifunctional operation, the portable electronic device may include a plurality of antennas for each function, and at least a portion thereof, as a built-in antenna, may be disposed in the external housing of the portable electronic device. Thus, a conductive contactor for an electrical contact between the antenna disposed in the external housing and the built-in circuit board of the portable electronic device has been used.

Furthermore, with respect to the portable electronic device, the use of a metallic material housing tends to be increased recently in order to improve robustness and aesthetics.

As a result, an electrical path may be formed between the external housing and the built-in circuit board by the conductive gasket or the conductive contactor. In particular, since the metal housing and the circuit board form a loop, static electricity may flow into the built-in circuit board through the conductive gasket or the conductive contactor to break a circuit, such as an integrated circuit (IC), when the static electricity having a high voltage instantly flows through a conductor such as the metal housing having a large externally exposed area.

With respect to the portable electronic device, batteries are generally charged by using a charger. The charger rectifies external alternating current (AC) power into direct current (DC) power and then transforms the DC power into lower DC power suitable to the portable electronic device through a transformer. Herein, Y-CAPs composed of a capacitor are provided to both ends of the transformer in order to enhance electrical insulation of the transformer.

However, in a case in which the Y-CAP does not have regular features as in a non-genuine charger, the DC power may not be sufficiently blocked by the Y-CAP, furthermore, a leakage current may occur due to the AC power, and the leakage current may flow through the ground of the circuit.

Since the leakage current may be transferred to a conductor contactable with the human body, e.g., an external case of the portable electronic device, a user may experience a prickling discomfort and in a severe case, an electric shock accident may occur in which the user may suffer injury.

Thus, there is a need to provide a protective device for protecting the user from the leakage current to the conductive gasket or the conductive contactor connecting the metal housing and the circuit board.

Furthermore, in a case in which the metal housing is used as an antenna, since a signal may be attenuated when the conductive gasket or the conductive contactor has low capacitance, the radio frequency (RF) signal may not be smoothly transmitted. Thus, there is a need to obtain high capacitance.

Thus, in line with the use of the conductor such as the metal case, there is a need to develop a contactor having various functions for protecting the user or the circuit in the portable electronic device as well as a simple electrical contact.

However, since additional components and elements are required for implementing these various functions and accordingly, an additional space in the circuit board of the portable electronic device must be secured, this may adversely affect the miniaturization of the portable electronic device.

SUMMARY OF THE INVENTION

An object of the present invention is to provide an electric shock protection contactor capable of protecting a user from a leakage current from an external power source and a portable electronic device including the same.

Another object of the present invention is to provide an electric shock protection contactor capable of protecting an internal circuit from a leakage current caused by static electricity and a portable electronic device including the same.

Another object of the present invention is to provide an electric shock protection contactor capable of transmitting a communication signal by minimizing the attenuation of the signal and a portable electronic device including the same.

According to an embodiment of the present invention, there is provided an electric shock protection contactor including: a conductive connection unit electrically in contact with a conductor of an electronic device; and an electric shock protection element connected to the conductive connection unit in series and blocking a leakage current of an external power source that is introduced from the ground of a circuit board of the electronic device.

The electric shock protection element may pass a communication signal introduced from the conductor.

The electric shock protection element may pass static electricity without causing dielectric breakdown when the static electricity is introduced from the conductor.

The electric shock protection element may include a groove in an upper side thereof, and at least a portion of the conductive connection unit may be inserted into the groove.

The electric shock protection element has a breakdown voltage (Vbr) satisfying an equation below:

$$Vbr > Vin$$

where Vin is a rated voltage of the external power source of the electronic device.

The electric shock protection element includes an electric shock protection unit and at least one capacitor layer, and the electric shock protection unit has a breakdown voltage (Vbr) satisfying an equation below:

$$Vbr > Vin, Vcp > Vbr$$

where Vin is a rated voltage of the external power source of the electronic device, and Vcp is a dielectric breakdown voltage of the capacitor layer.

The conductive connection unit may be any one of a conductive gasket, a silicon rubber pad, and a clip-shaped conductor having an elastic force.

The conductive gasket may include at least one of a polymer body, a natural rubber, a sponge, a synthetic rubber, a heat-resistant silicon rubber, and a tube, prepared by thermal compression of a conductive paste.

The silicon rubber pad may include: a body formed of a silicon rubber; and a conductive wire vertically formed in the body.

The silicon rubber pad may include: a body formed of a silicon rubber; and a conductive wire diagonally formed in the body.

The silicon rubber pad may include: a body formed of a silicon rubber; a plurality of conductive layers horizontally alternately stacked in the body; and a plurality of contact portions formed in a curved protrusion shape on an upper side of the body.

The clip-shaped conductor may include: a contact portion having a curved shape and in contact with the conductor; an extension portion extending from the contact portion and having an elastic force; and a terminal portion electrically connected to the electric shock protection element.

The electric shock protection element may include an external electrode on a bottom surface of the groove, and the conductive connection unit may be stacked on the external electrode via a conductive adhesive layer.

The electric shock protection element may include: a sintered body in which a plurality of sheet layers is stacked; at least one pair of internal electrodes spaced apart by a predetermined spacing in the sintered body; and a pore formed between the internal electrodes.

The pair of internal electrodes may be disposed on the same plane.

The pore may include a discharging material layer that is coated on an inner wall along a height direction to a predetermined thickness.

The electric shock protection element may include: at least two varistor material layers in which a first varistor material layer and a second varistor material layer are alternately stacked; a plurality of first internal electrodes spaced apart by a predetermined spacing (L) on the first varistor material layer; and a plurality of second internal electrodes spaced apart by the predetermined spacing (L) on the second varistor material layer.

The breakdown voltage (Vbr) may be a sum of breakdown voltages respectively formed between the nearest first internal electrode and second internal electrode.

Each of the first internal electrode and the second internal electrode may be disposed such that at least portions thereof overlap or do not overlap each other.

The spacing (L) between the first internal electrodes or the second internal electrodes may be greater than a sum of the shortest distance (d1) between the first internal electrode and the second internal electrode and the shortest distance (d2) between the other neighboring first internal electrode and the second internal electrode.

The capacitor layer may be electrically connected to the electric shock protection unit in parallel.

A spacing between the capacitor layer and the electric shock protection unit may be greater than a spacing between the pair of internal electrodes of the electric shock protection unit.

The electric shock protection element may include: a sintered body in which a plurality of sheet layers is stacked; an electric shock protection unit including at least one pair of internal electrodes spaced apart by a predetermined spacing in the sintered body and a pore formed between the internal electrodes; and at least one stacked capacitor layer passing the communication signal.

The electric shock protection element may include: an electric shock protection unit comprising at least two varistor material layers in which a first varistor material layer and a second varistor material layer are alternately stacked, a plurality of first internal electrodes spaced apart by a predetermined spacing (L) on the first varistor material layer, and a plurality of second internal electrodes spaced apart by the predetermined spacing (L) on the second varistor material layer; and at least one stacked capacitor layer passing the communication signal.

According to another embodiment of the present invention, there is provided a portable electronic device including: a conductor contactable with a human body; a circuit board in which a plurality of passive elements and a plurality of active elements are installed; and an electric shock protection contactor having one end electrically connected to the circuit board and another end electrically connected to the conductor in series, wherein the electric shock protection contactor includes: a conductive connection unit electrically in contact with a conductor; and an electric shock protection element connected to the conductive connection unit in series and blocking a leakage current of an external power source that is introduced from the ground of the circuit board.

The conductor may include at least one of an antenna for communication between the electronic device and an external device, a metal case, and conductive accessories.

BRIEF DESCRIPTION OF THE DRAWINGS

The accompanying drawings are included to provide a further understanding of the present invention, and are incorporated in and constitute a part of this specification. The drawings illustrate exemplary embodiments of the present invention and, together with the description, serve to explain principles of the present invention. In the drawings.

DETAILED DESCRIPTION OF PREFERRED EMBODIMENTS

Figure 1:
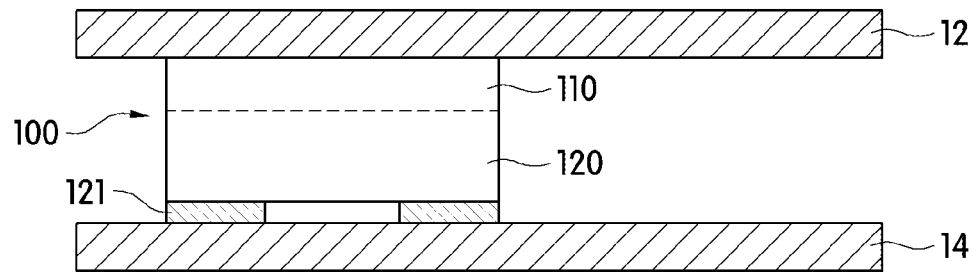
FIG. 1 is a cross-sectional view of an example in which an electric shock protection contactor according to an embodiment of the present invention is applied to a portable electronic device.

Hereinafter, exemplary embodiments of the present invention will be described in detail with reference to the accompanying drawings in such a manner that it may easily be carried out by a person with ordinary skill in the art to which the invention pertains. The present invention may, however, be embodied in many different forms and should not be constructed as limited to the embodiments set forth herein. In the drawings, parts not related to descriptions are omitted for clarity, and like reference numerals in the drawings denote like elements throughout.

An electric shock protection contactor 100 according to an embodiment of the present invention includes a conductive connection unit 110 and an electric shock protection element 120.

Figure 2:
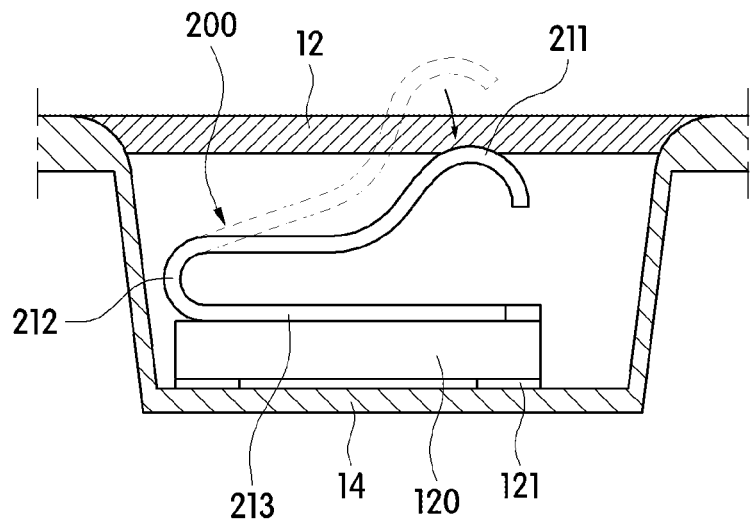
FIG. 2 is a cross-sectional view of another example in which an electric shock protection contactor according to an embodiment of the present invention is applied to a portable electronic device.

The electric shock protection contactor 100, as illustrated in FIGS. 1 and 2, is for electrically connecting between a conductor 12, such as an external metal case, and a circuit board 14 in a portable electronic device.

Herein, the portable electronic device may be in the form of a portable electronic apparatus which is portable and easily handled. For example, the portable electronic device may be a mobile device such as a smart phone and a cellular phone, and may be a smart watch, a digital camera, a digital multimedia broadcasting (DMB) receiver, an electronic book, a net book, a tablet PC, or a portable computer. These electronic devices may include any appropriate electronic components including antenna structures for communicating with an external device. In addition, the portable electronic device may be a device using a local area network such as Wi-Fi and Bluetooth.

The electric shock protection contactor 100 may be pressed by a pressing force for coupling the conductor 12 to the portable electronic device and may have an elastic force so as to be restored to its original state in a case in which the conductor 12 is released from the portable electronic device.

Herein, the conductor 12 may be provided to partially surround or entirely surround sides of the portable electronic device and may be an antenna for the communication between the portable electronic device and the external device.

The conductive connection unit 110 may be electrically in contact with the conductor 12 of the portable electronic device and may have an elastic force. The conductive connection unit 110 may be a conductive gasket or a silicon rubber pad as illustrated in FIG. 1 and may be a clip-shaped conductor having an elastic force as illustrated in FIG. 2.

Herein, in a case in which the conductive connection unit 110 is in surface contact with the conductor 12 like the conductive gasket or the silicon rubber pad, the conductive connection unit 110 may be formed of a conductive material having an elastic force in one piece. In this case, the conductive connection unit 110 may shrink toward the circuit board 14 due to the pressing force of the conductor 12 and may be restored to its original state by the elastic force in the case in which the conductor 12 is released from the portable electronic device.

Also, in a case in which the conductive connection unit is in contact with the conductor 12 like clip-shaped conductors having an elastic force 211, 212, and 213, the extension portion 212 having an elastic force is pressed toward the circuit board 14 as the contact portion 211 is pressed by the circuit board 14, and the conductive connection unit 110, as illustrated in FIG. 2, may be restored to its original state, i.e., an upper side of a mounting portion of the circuit board 14, by the elastic force of the extension portion 212 when the conductor 12 is released from the portable electronic device.

The electric shock protection element 120 is electrically connected to the conductive connection unit 110 in series and for example, may be disposed under the conductive connection unit 110. In this case, an external electrode may be disposed on a top surface of the electric shock protection element.

The electric shock protection element 120 includes a groove in an upper side thereof, an external electrode is included on a bottom surface of the groove, and the conductive connection unit 110 may be stacked on the external electrode via a conductive adhesive layer.

In this case, the electric shock protection element 120 may be a suppressor or a varistor.

The electric shock protection element 120 may have a breakdown voltage (Vbr) satisfying the following equation so as to block a leakage current of an external power source:

$$Vbr > Vin$$

where Vin is a rated voltage of the external power source of the electronic device.

In this case, the rated voltage may be a national standard rated voltage and for example, may be any one of 240 V, 110 V, 220 V, 120 V, 110 V, and 100 V.

In a case in which the conductor 12 has the function of an antenna, the electric shock protection element 120 may be a suppressor or varistor including a capacitor layer.

The electric shock protection element 120 may include an electric shock protection unit and at least one capacitor layer, and may have the breakdown voltage (Vbr) of the electric shock protection unit which satisfies the following condition so as to block the leakage current of the external power source and pass a communication signal introduced from the conductor 12:

$$Vbr > Vin$$

where Vin is a rated voltage of the external power source of the electronic device.

In this case, when the electric shock protection element 120 has the function of passing static electricity in order to protect a circuit unit at the rear end, the breakdown voltage (Vbr) of the electric shock protection unit satisfies the following condition:

$$Vcp > Vbr$$

where Vcp is a dielectric breakdown voltage of the capacitor layer.

Figure 3:
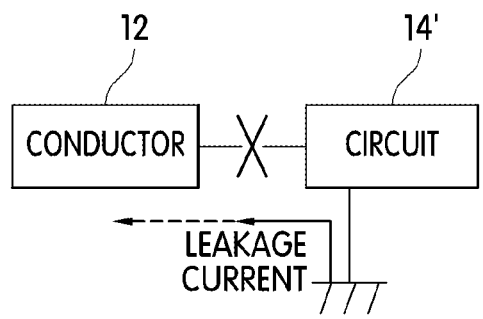
FIG. 3 is schematic equivalent circuit diagrams for describing operations on leakage current when the electric shock protection contactor according to the embodiment of the present invention is installed in the portable electronic device.
Figure 4:
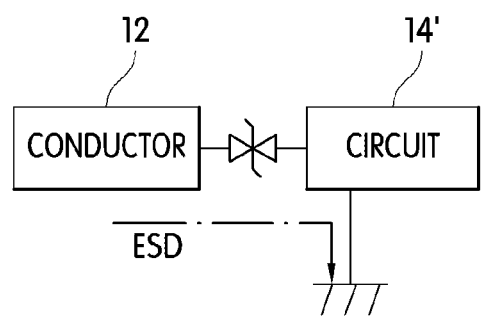
FIG. 4. 4 is schematic equivalent circuit diagrams for describing operations on electrostatic discharge (ESD) when the electric shock protection contactor according to the embodiment of the present invention is installed in the portable electronic device.
Figure 5:
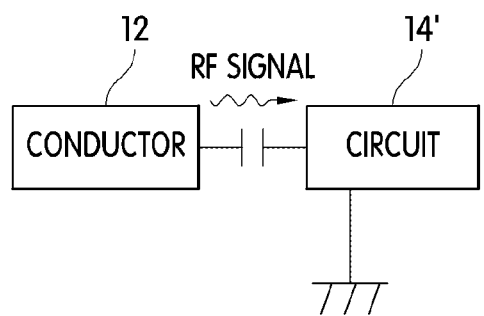
FIG. 5 is schematic equivalent circuit diagrams for describing operations on communication signal when the electric shock protection contactor according to the embodiment of the present invention is installed in the portable electronic device.

As illustrated in FIGS. 3 to 5, the electric shock protection element 120 may have different functions depending on the leakage current of the external power source and the static electricity and communication signal introduced from the conductor 12.

That is, as illustrated in FIG. 3, in a case in which the leakage current of the external power source is introduced into the conductor 12 through a circuit unit 14' mounted on the circuit board 14, for example, ground, since the breakdown voltage (or trigger voltage) (Vbr) of the electric shock protection element 120 is greater than an overvoltage due to the leakage current, the electric shock protection element 120 may be maintained in an open state. That is, since the breakdown voltage (Vbr) of the electric shock protection element 120 is greater than the rated voltage of the external power source of the portable electronic device, the electric shock protection element 120 is not electrically conducted and maintained in the open state, and thus, the electric shock protection element 120 may block the flow of the leakage current to the conductor 12 contactable with the human body, for example, a metal case.

In this case, in a case in which a capacitor layer is included in the electric shock protection element 120, since the capacitor layer may block a direct current (DC) component included in the leakage current and the leakage current has a relatively lower frequency than a wireless communication band, the capacitor layer may block the leakage current by acting as a large impedance to the corresponding frequency.

As a result, the electric shock protection element 120 may protect a user from electric shock by blocking the leakage current of the external power source that is introduced from the ground of the circuit unit 14'.

Also, as illustrated in FIG. 4, when the static electricity is introduced from the outside through the conductor 12, the electric shock protection element 120 functions as an electrostatic discharge protection element such as a suppressor or varistor. That is, in a case in which the electric shock protection element 120 is in the form of a varistor, since its breakdown voltage (Vbr) is smaller than an instantaneous voltage of the static electricity, the electric shock protection element 120 may be electrically conducted to pass the static electricity. Also, in a case in which the electric shock protection element 120 is in the form of a suppressor, since an operating voltage of the suppressor for electrostatic discharge is smaller than the instantaneous voltage of the static electricity, the electric shock protection element 120 may pass the static electricity by instantaneous discharge. As a result, since the electrical resistance of the electric shock protection element 120 may be decreased when the static electricity is introduced from the conductor 12, the electric shock protection element 120 may pass the static electricity without causing dielectric breakdown.

In this case, when the capacitor layer is included in the electric shock protection element 120, since the dielectric breakdown voltage (Vcp) of the capacitor layer is greater than the breakdown voltage (Vbr) of the electric shock protection unit, the static electricity is not introduced into the capacitor layer and may only pass through the electric shock protection unit.

Herein, the circuit unit 14' may include a separate protection element for bypassing the static electricity to the ground. As a result, since the electric shock protection element 120 is not subjected to dielectric breakdown caused by the static electricity introduced from the conductor 12 and passes the static electricity, the electric shock protection element 120 may protect an internal circuit at the rear end.

Also, as illustrated in FIG. 5, in a case in which a communication signal is introduced through the conductor 12, the electric shock protection element 120 functions as a capacitor. That is, since the electric shock protection unit is maintained in an open state, the electric shock protection element 120 blocks the conductor 12 and the circuit unit 14'. However, the capacitor layer in the electric shock protection element 120 may pass the introduced communication signal. Thus, the capacitor layer of the electric shock protection element 120 may provide an incoming path of the communication signal.

Figure 6:
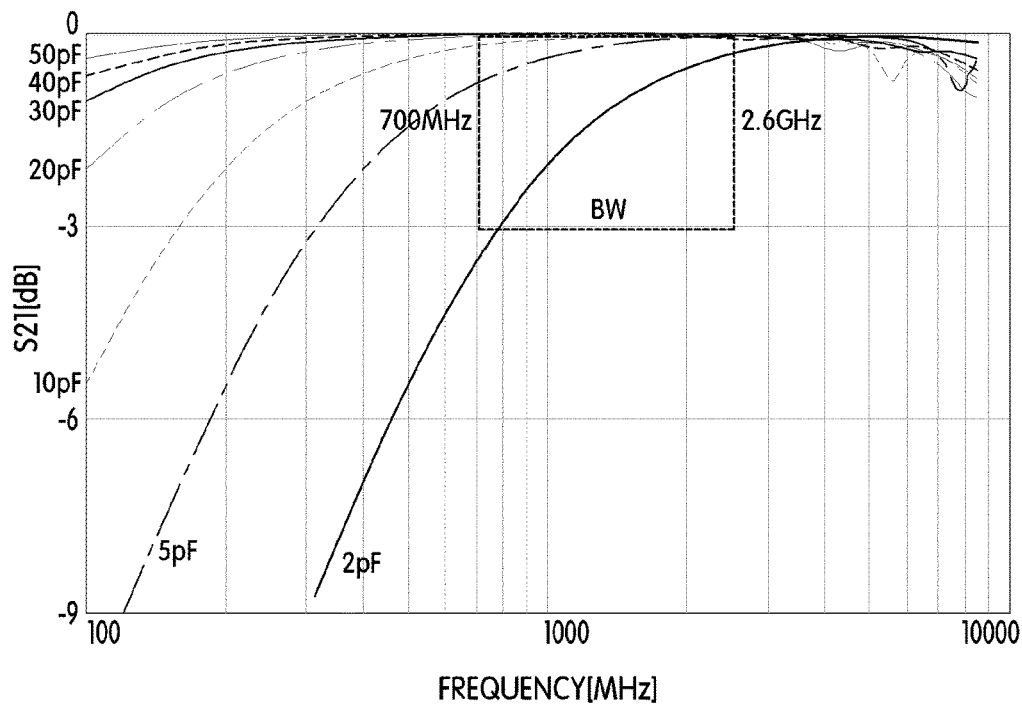
FIGS. 6 and 7 are graphs illustrating simulation results of pass frequency band according to capacitance.
Figure 7:
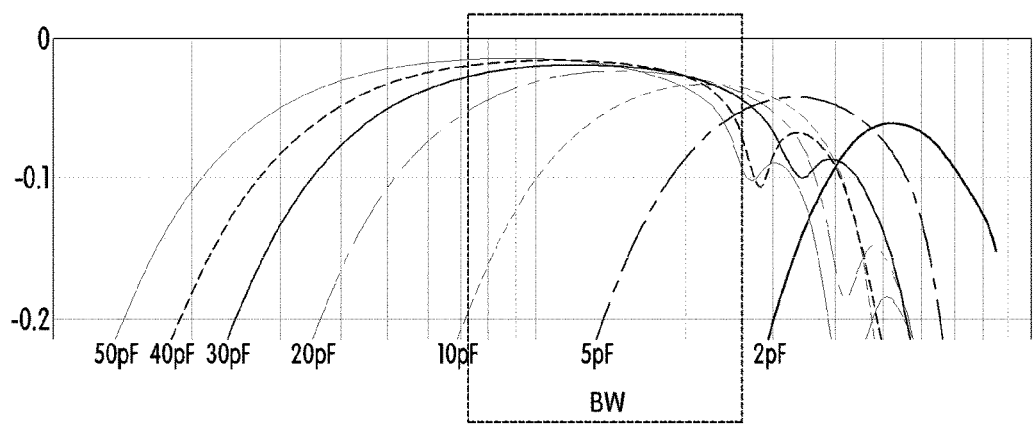

Herein, capacitance of the capacitor layer may be set to pass communication signals in major wireless communication bands without attenuation. As illustrated in FIGS. 6 and 7, according to simulation results of pass frequency band according to capacitance, the signal may be substantially transmitted almost without a loss in a mobile wireless communication frequency band (700 MHz to 2.6 GHz) with respect to a capacitance of 5 pF or more, and thus, it exhibits an electrical short circuit phenomenon.

However, as illustrated in FIG. 7, when microscopic effects are analyzed, it may be understood that the signal is almost not affected by reception sensitivity during the communication at a capacitance of about 30 pF or more. Thus, with respect to the capacitance of the capacitor layer, it is desirable to use a high capacitance of 30 pF or more in the mobile wireless communication frequency band.

As a result, the electric shock protection element 120 may pass the communication signal introduced from the conductor 12 without attenuation by the high capacitance of the capacitor layer.

Hereinafter, the electric shock protection contactor according to the embodiment of the present invention will be described in more detail with reference to FIGS. 8 and 9.

Figure 8:
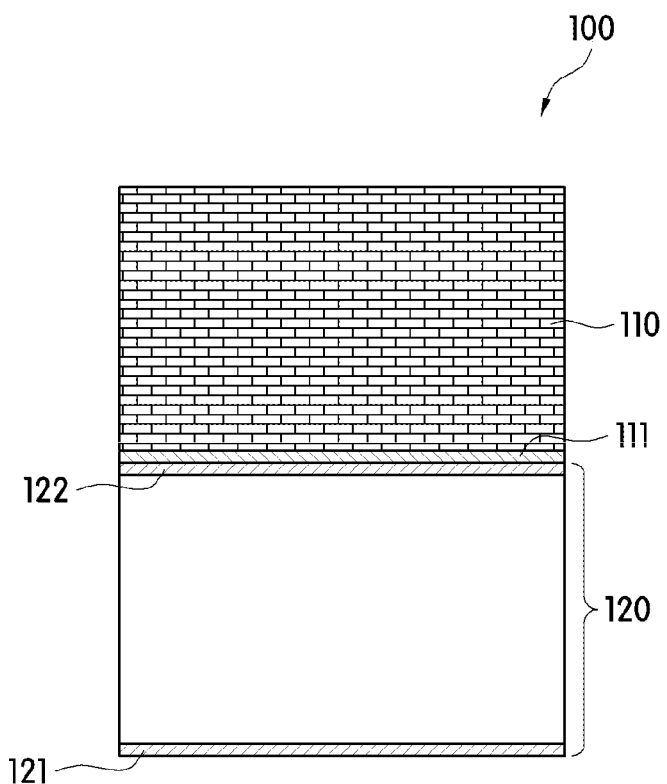
FIGS. 8 and 9 are cross-sectional views illustrating an example of the electric shock protection contactor according to the embodiment of the present invention.
Figure 9:
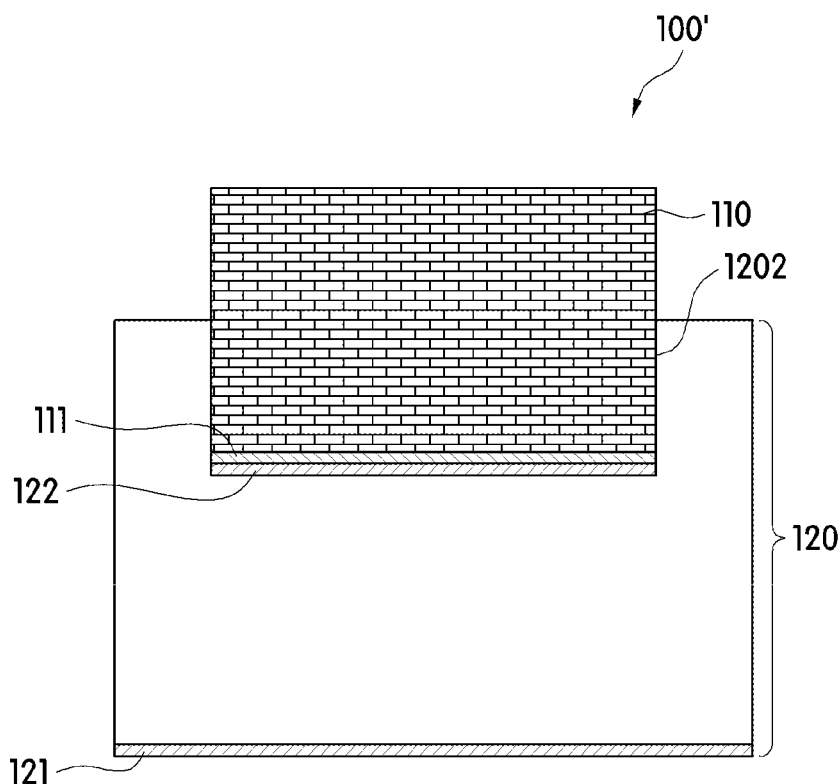

As illustrated in FIGS. 8 and 9, electric shock protection contactors 100 and 100' may include a conductive gasket 110, as the conductive connection unit, and an electric shock protection element 120.

The conductive gasket 110 may be formed of a conductive material having an elastic force in one piece. The conductive gasket 110, for example, may include at least one of a polymer body, a natural rubber, a sponge, a synthetic rubber, a heat-resistant silicon rubber, and a tube, prepared by thermal compression of a conductive paste. The conductive gasket is not limited thereto and may include a conductive material having an elastic force.

As illustrated in FIG. 1, a top of the conductive gasket 110 may be in surface contact with the conductor 12 such as a metal housing or an antenna, and a bottom thereof may be electrically connected to the electric shock protection element 120.

An external electrode 121 and a connection electrode 122 may be respectively formed on a bottom surface and a top surface of the electric shock protection element 120. In this case, as illustrated in FIG. 8, a conductive adhesive layer 111 may be coated on the connection electrode 122 on the top surface of the electric shock protection element 120, and the conductive gasket 110 may be stacked via the conductive adhesive layer 111.

Also, as illustrated in FIG. 9, the electric shock protection element 120 may include a groove 1202 in the top surface thereof. Herein, the electric shock protection element 120 may include the connection electrode 122 on the bottom surface of the groove 1202. In this case, at least a portion of the conductive gasket 110 may be inserted and stacked in the groove 1202 via the conductive adhesive layer 111.

Herein, although it has been described that the external electrode 121 and the connection electrode 122 are respectively formed on the bottom surface and the top surface of the electric shock protection element 120, the embodiment of the present invention is not limited thereto and the external electrode 121 and the connection electrode 122 may be provided on side surfaces of the electric shock protection element 120.

In this case, the electric shock protection element 120 may include various types of suppressors or varistors. That is, the electric shock protection element 120, as a single element, may be a suppressor or a varistor. Selectively, in a case in which the electric shock protection contactor must have a function of passing the communication signal as in the case that the electric shock protection contactor is connected to a conductor such as an antenna, the electric shock protection element 120, as a composite element, may be a suppressor including a capacitor layer or a varistor including a capacitor layer.

Figure 10:
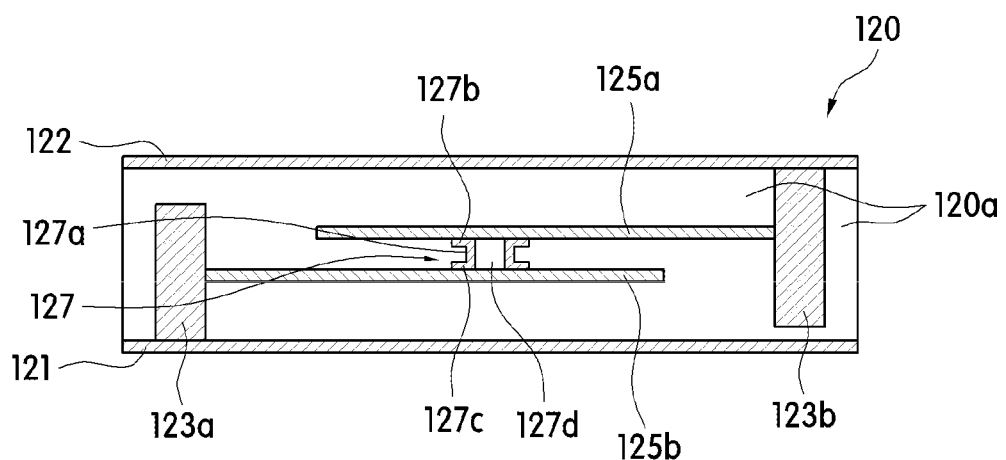
FIGS. 10 to 13 are cross-sectional views illustrating various configurations of an electric shock protection element of the example of the electric shock protection contactor according to the embodiment of the present invention.

As illustrated in FIG. 10, in the case that the electric shock protection element 120 is a single suppressor element, the electric shock protection element 120 includes a sintered body 120a, internal electrodes 125a and 125b, and a pore-forming member 127.

A plurality of sheet layers are sequentially stacked, electrodes respectively disposed on one surface of each sheet layer are disposed to face each other, and the sintered body 120a is then formed in one piece through a pressing and sintering process.

The sintered body 120a, as a stack of the plurality of sheet layers, may be formed of an insulator having permittivity, for example, a ceramic material. In this case, the ceramic material is a metal-based oxide compound, and the metal-based oxide compound may include at least one selected from the group consisting of $Er_2O_3$, $Dy_2O_3$, $Ho_2O_3$, $V_2O_5$, CoO, $MoO_3$, $SnO_2$, $BaTiO_3$, and $Nd_2O_3$.

Herein, the external electrode 121 for mounting on the circuit board 14 may be disposed on a bottom surface of the sintered body 120a and the connection electrode 122 for connecting to the conductive gasket 110 may be disposed on a top surface thereof. Intermediated electrodes 123a and 123b respectively connected to the external electrode 121 and the connection electrode 122 may be respectively included in both sides of the sintered body 120a. That is, the intermediate electrode 123a may be connected to the external electrode 121 and the intermediate electrode 123b may be connected to the connection electrode 122. Selectively, the external electrode 121 and the connection electrode 122 may be respectively included in side surfaces of the sintered body 120a.

The internal electrodes 125a and 125b are spaced apart by a predetermined spacing in the sintered body 120a and may be composed of at least one pair. Herein, the first internal electrode 125a may be connected to the intermediate electrode 123a and the second internal electrode 125b may be connected to the intermediate electrode 123b.

The internal electrodes 125a and 125b and the intermediated electrodes 123a and 123b may include at least one component of silver (Ag), gold (Au), platinum (Pt), palladium (Pd), nickel (Ni), and copper (Cu), and the external electrode 121 and the connection electrode 122 may include at least one component of Ag, Ni, and tin (Sn).

In this case, the internal electrodes 125a and 125b may be provided in various shapes and patterns, and the first internal electrode 125a and the second internal electrode 125b may be provided in the same pattern or may be provided to have different patterns from each other. That is, the internal electrodes 125a and 125b are not limited to a particular pattern if portions of the first internal electrode 125a and the second internal electrode 125b face each other and are disposed to overlap each other during the configuration of the sintered body.

A spacing between the internal electrodes 125a and 125b may be configured to satisfy the breakdown voltage (Vbr) of the electric shock protection element 120 and for example, may be in a range of 10 μm to 100 μm.

The pore-forming member 127 may be disposed between the internal electrodes 125a and 125b and may include discharging material layers 127a, 127b, and 127c coated on an inner wall along a height direction to a predetermined thickness. Herein, a discharging material constituting the discharging material layers 127a, 127b, and 127c may have low permittivity, no conductivity, and no short circuit when the overvoltage is applied.

For this purpose, the discharging material may be formed of a non-conductive material including at least one type of metal particles and may be formed of a semiconductor material including a SiC or silicon-based component.

For example, in a case in which the first internal electrode 125a and the second internal electrode 125b include an Ag component, the discharging material may include a SiC—ZnO-based component. The silicon carbide (SiC) component has excellent thermal stability, excellent stability in an oxidation atmosphere, constant electrical and thermal conductivities, and low permittivity.

The ZnO component has excellent non-linear resistance characteristics and discharge characteristics.

Both SiC and ZnO have conductivity when they are separately used, but since ZnO is combined to surfaces of SiC particles when they are mixed and then sintered, an insulation layer, as a material having low conductivity, is formed.

In the insulation layer, SiC is completely reacted to form a SiC—ZnO reaction layer on the surfaces of the SiC particles. Accordingly, since the insulation layer may provide higher insulation properties to the discharging material by blocking Ag paths and may improve resistance to static electricity, a DC short-circuit phenomenon may be addressed when installing the suppressor 120 in the electronic component.

Herein, although it has been described that the SiC—ZnO-based component is included as an example of the discharging material, the embodiment of the present invention is not limited thereto, and a semiconductor material matched with the component constituting the first internal electrode 125a and the second internal electrode 125b or a non-conductive material including metal particles may be used as the discharging material.

In this case, the discharging material layers 127a, 127b, and 127c coated on the inner wall of the pore-forming member 127 may include the first portion 127a coated along the inner wall of the pore-forming member 127, the second portion 127b extending from an upper end of the first portion 127a to face and contact with the first internal electrode 125a, and the third portion 127c extending from a lower end of the first portion 127a to face and contact with the second internal electrode 125b.

Accordingly, since the discharging material layers 127a, 127b, and 127c may be formed such that the second portion 127b and the third portion 127c respectively extend from the upper end and the lower end of the pore-forming member 127 as well as the inner wall of the pore-forming member 127, the discharging material layers 127a, 127b, and 127c may increase contact areas with the first internal electrode 125a and the second internal electrode 125b.

The reason for this is that even if a portion of the discharging material layers 127a, 127b, and 127c is damaged because a portion of the components constituting the discharging material layers 127a, 127b, and 127c is vaporized by a spark caused by static electricity due to the overvoltage, the resistance to static electricity is increased to allow the discharging material layers 127a, 127b, and 127c to be able to perform their functions.

A pore 127d may be formed between the pair of internal electrodes 125a and 125b by the pore-forming member 127. The static electricity introduced from the outside may be discharged between the internal electrodes 125a and 125b by the pore 127d. In this case, electrical resistance between the internal electrodes 125a and 125b may be decreased, and a voltage difference between both ends of the electric shock protection contactor 100 may be reduced to a predetermined value or less. Thus, the electric shock protection element 120 may pass the static electricity without causing dielectric breakdown.

The pore-forming member 127 may be provided in plurality. Since discharge paths of the static electricity may increase when the number of the pore-forming members 127 is increased, the resistance to static electricity may be increased.

Figure 11:
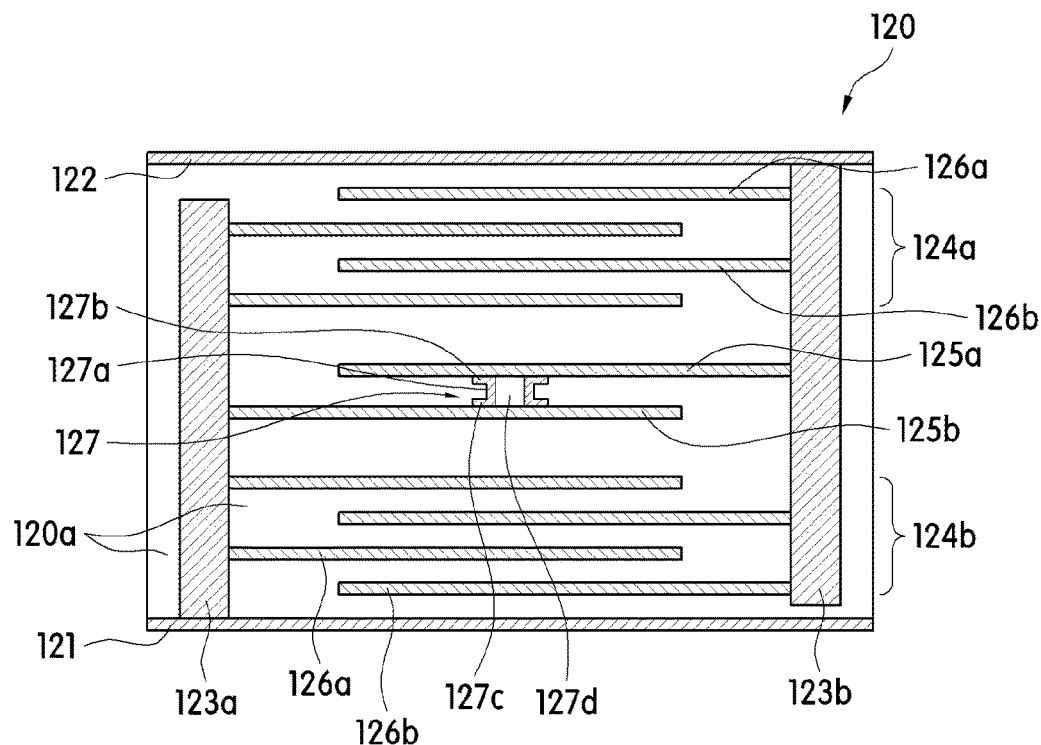

As illustrated in FIG. 11, in a case in which the electric shock protection element 120 is a composite suppressor element including a capacitor layer, the electric shock protection element 120 includes a sintered body 120a, an electric shock protection unit, and capacitor layers 124a and 124b. Herein, the electric shock protection unit may include internal electrodes 125a and 125b and a pore-forming member 127.

In this case, the sintered body 120a may be a stack of a plurality of sheet layers. Herein, the sheet layers, in which the upper capacitor layer 124a, the lower capacitor layer 124b, and the internal electrodes 125a and 125b are formed, may be formed of the same material, but may be selectively formed of different heterogeneous materials.

The capacitor layers 124a and 124b may be at least one stacked capacitor layer passing the communication signal. The capacitor layers 124a and 124b may be electrically connected to the electric shock protection unit in parallel, for example, may be formed above or under the electric shock protection unit, and may include capacitor electrodes 126a and 126b.

The capacitor layers 124a and 124b are for improving radio frequency (RF) reception sensitivity by providing additional capacitance of the electric shock protection element 120.

Unlike a typical case in which a separate component for increasing the RF reception sensitivity is used together with a suppressor, varistor, or Zener diode for protecting an internal circuit against static electricity, an increase in the RF reception sensitivity as well as the protection against static electricity may be achieved by the capacitor layers 124a and 124b of the single suppressor.

Figure 12:
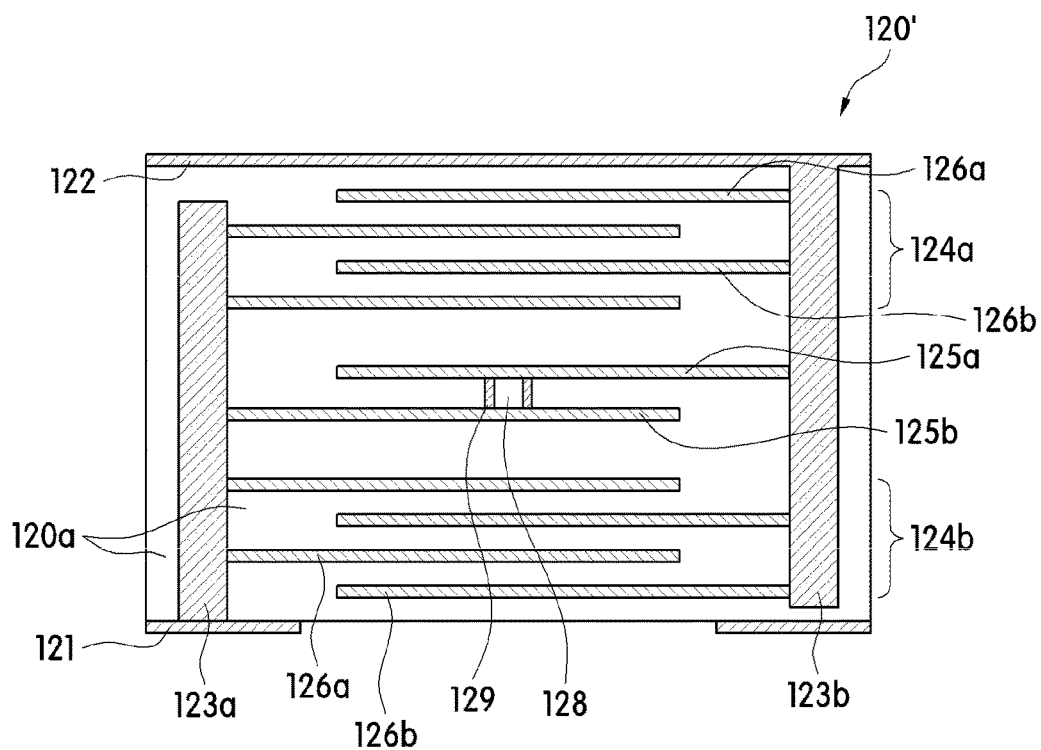

As illustrated in FIG. 12, in an electric shock protection element 120', a pore 128 may be formed between internal electrodes 125a and 125b without using a separate pore-forming member. In this case, a sidewall of the pore 128 may include a discharging material layer 129.

Figure 13:
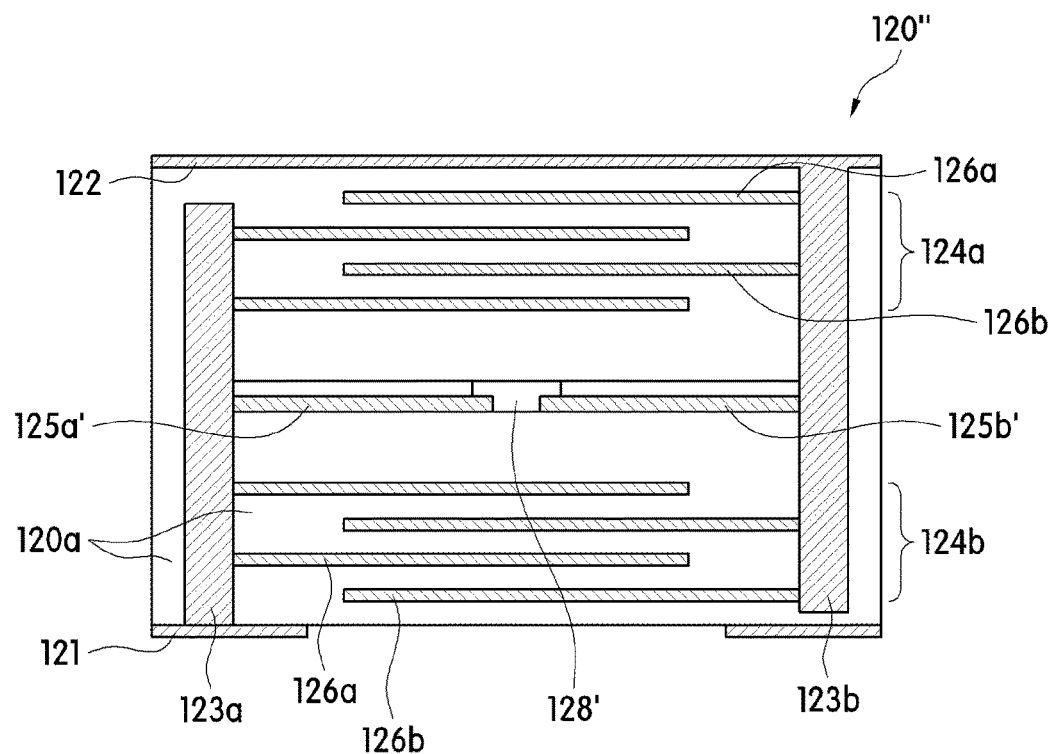

As illustrated in FIG. 13, an electric shock protection element 120" may include horizontal electrodes formed on the same plane. That is, the electric shock protection element 120" may include a pair of internal electrodes 125a' and 125b' which is horizontally disposed by being spaced apart by a predetermined spacing.

In this case, a pore 128' may be formed between the pair of internal electrodes 125a' and 125b'. Herein, the pore 128' may be formed to have a greater height than a height of the pair of internal electrodes 125a' and 125b' and may be formed to have a greater width than a spacing of the pair of internal electrodes 125a' and 125b'. Thus, when a volume of the pore 128' is expanded, since a space between the internal electrodes 125a' and 125b' is large even if fine particles are formed from the internal electrodes 125a' and 125b' during the discharge caused by static electricity, the incidence of defects, which may be generated by the particles, may be reduced.

Figure 14:
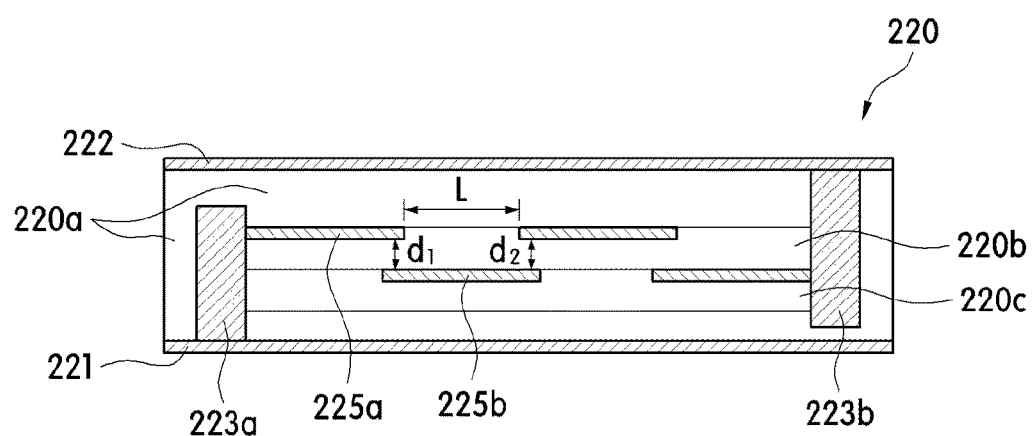
FIGS. 14 and 15 are cross-sectional views illustrating various configurations of an electric shock protection element of the example of the electric shock protection contactor according to the embodiment of the present invention.

As illustrated in FIG. 14, in a case in which an electric shock protection element 220 is a single varistor element, the electric shock protection element 220 includes varistor material layers 220b and 220c and internal electrodes 225a and 225b.

An external electrode 221 for mounting the circuit board 14 may be provided on a bottom surface of the electric shock protection element 220, and a connection electrode 222 for connecting to a conductive gasket or a clip-shaped conductor may be provided on a top surface of the electric shock protection element 220.

In this case, intermediate electrodes 223a and 223b respectively connected to the external electrode 221 and the connection electrode 222 may be provided on both sides of the electric shock protection element 220. That is, the intermediate electrode 223a may be connected to the external electrode 221 and the intermediate electrode 223b may be connected to the connection electrode 222. Selectively, the external electrode 221 and the connection electrode 222 may be provided on side surfaces of the sintered body 120a.

The varistor material layer may be composed of at least two layers of alternating first varistor material layer 220b and second varistor material layer 220c. Herein, the first varistor material layer 220b and the second varistor material layer 220c may be a semiconducting material including at least one of ZnO, SrTiO$_3$, BaTiO$_3$, and SiC, or any one of praseodymium (Pr) and bismuth (Bi)-based materials.

The internal electrodes 225a and 225b may include the plurality of first internal electrodes 225a spaced apart by a predetermined spacing L on the first varistor material layer 220b and the plurality of second internal electrodes 225b spaced apart by a predetermined spacing L on the second varistor material layer 220c.

Herein, the breakdown voltage (Vbr) of the varistor 220 may be a sum of breakdown voltages respectively formed between the nearest first internal electrode 225a and second internal electrode 225b.

Each of the first internal electrode 225a and the second internal electrode 225b may be disposed such that at least portions of the first internal electrode 225a and the second internal electrode 225b do not overlap. That is, each of the first internal electrode 225a and the second internal electrode 225b may be alternately disposed such that at least portions thereof overlap or may be alternately disposed between each other such that at least portions thereof do not overlap each other.

Also, with respect to the first internal electrode or the second internal electrode, the spacing may be set so that static electricity or leakage current does not leak to an adjacent position of the internal electrodes 225a and 225b, but normally flows between the internal electrodes 225a and 225b.

For example, the spacing L between the single first internal electrode 225a and the neighboring first internal electrode 225a may be formed to be greater than a sum of the shortest distance d1 between the first internal electrode 225a and the second internal electrode 225b and the shortest distance d2 between the neighboring first internal electrode 225a and the second internal electrode 225b.

Figure 15:
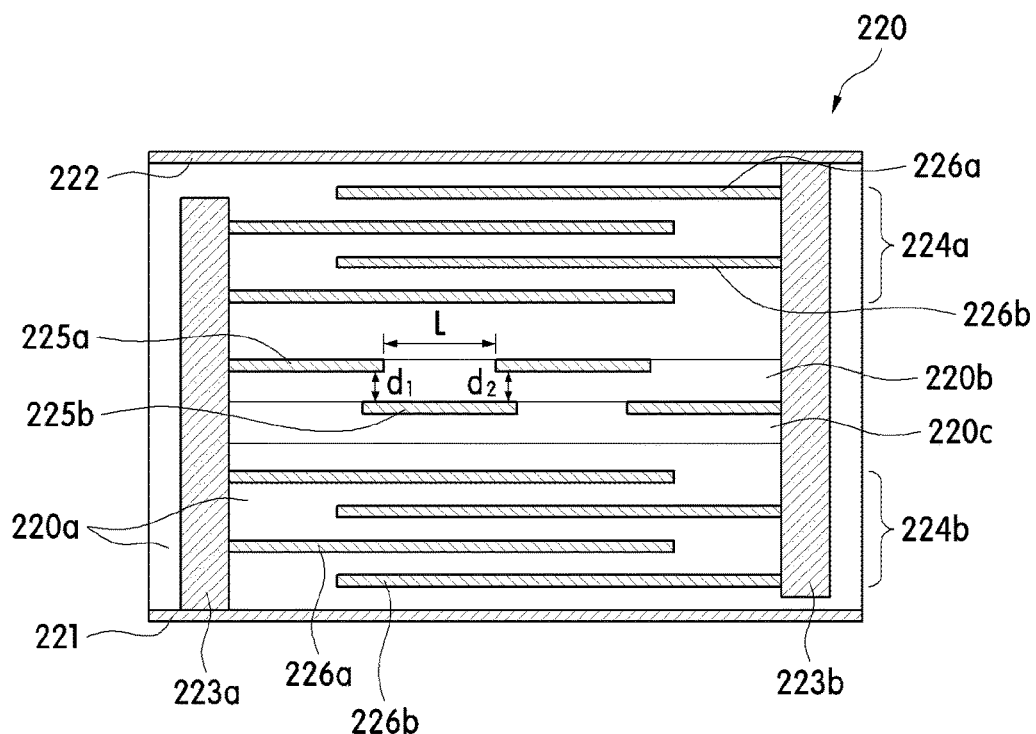

As illustrated in FIG. 15, in a case in which the electric shock protection element 220 is a composite varistor element including a capacitor layer, the electric shock protection element 220 includes an electric shock protection unit and capacitor layers 224a and 224b. Herein, the electric shock protection unit includes varistor material layers 220b and 220c and internal electrodes 225a and 225b.

The capacitor layers 224a and 224b may be at least one stacked capacitor layer passing the communication signal. The capacitor layers 224a and 224b may be electrically connected to the electric shock protection unit in parallel, for example, may be formed above or under the electric shock protection unit, and may include capacitor electrodes 226a and 226b.

Herein, a sheet layer 220a constituting the capacitor layers 224a and 224b is a stack of the plurality of sheet layers and may be formed of an insulator having permittivity, for example, a ceramic material. In this case, the ceramic material is a metal-based oxide compound, and the metal-based oxide compound may include at least one selected from the group consisting of $Er_2O_3$, $Dy_2O_3$, $Ho_2O_3$, $V_2O_5$, $CoO$, $MoO_3$, $SnO_2$, and $BaTiO_3$. The upper capacitor layer 224a and the lower capacitor layer 224b may be formed of the same material, but may be selectively formed of different heterogeneous materials.

Also, with respect to the first internal electrode or the second internal electrode, a spacing may be set so that static electricity or leakage current does not leak to capacitor electrodes 226a and 226b adjacent to the internal electrodes 225a and 225b, but normally flows between the internal electrodes 225a and 225b.

That is, distances between each of the first internal electrode 225a and the second internal electrode 225b and the adjacent capacitor electrodes 226a and 226b may be formed to be greater than the spacing L between the internal electrodes 225a and 225b.

As illustrated in FIGS. 16 to 19, electric shock protection contactors 220 and 220' are cases in which a conductive connection unit is a clip-shaped conductor 210, wherein the clip-shaped conductor 210 includes a contact portion 211, an extension portion 212, and a terminal portion 213.

The contact portion 211 has a curved shape and may be electrically in contact with the conductor 12 as illustrated in FIG. 2. The extension portion 212 may be extending from the contact portion 211 and may have an elastic force. The terminal portion 213 may include a terminal that is electrically connected to the electric shock protection unit.

The contact portion 211, the extension portion 212, and the terminal portion 213 may be formed of a conductive material having an elastic force in one piece.

Figure 16:
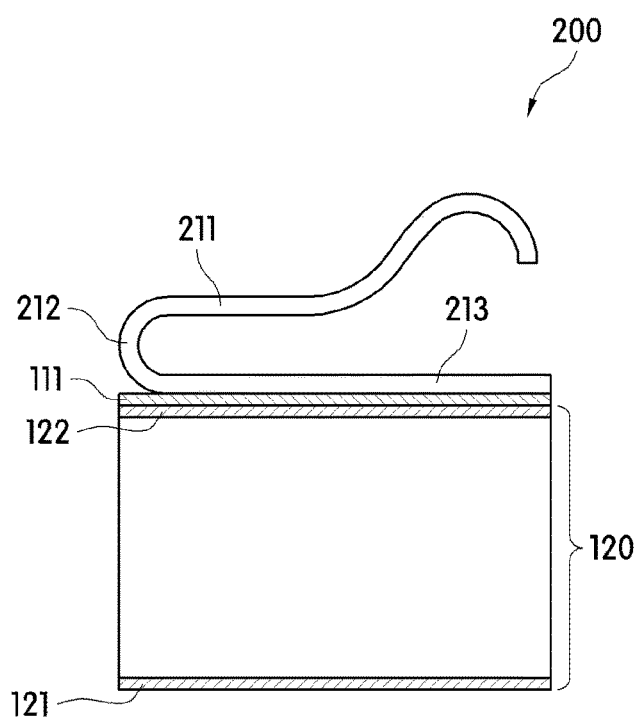
FIGS. 16 to 19 are cross-sectional views illustrating another example of the electric shock protection contactor according to the embodiment of the present invention.

An external electrode 121 and a connection electrode 122 may be respectively formed on a bottom surface and a top surface of the electric shock protection element 120. In this case, as illustrated in FIG. 16, a conductive adhesive layer 111 may be coated on the connection electrode 122 on the top surface of the electric shock protection element 120, and the clip-shaped conductor 210 may be installed so that it may be electrically connected to the top surface of the electric shock protection element 120 via the conductive adhesive layer 111.

Figure 17:
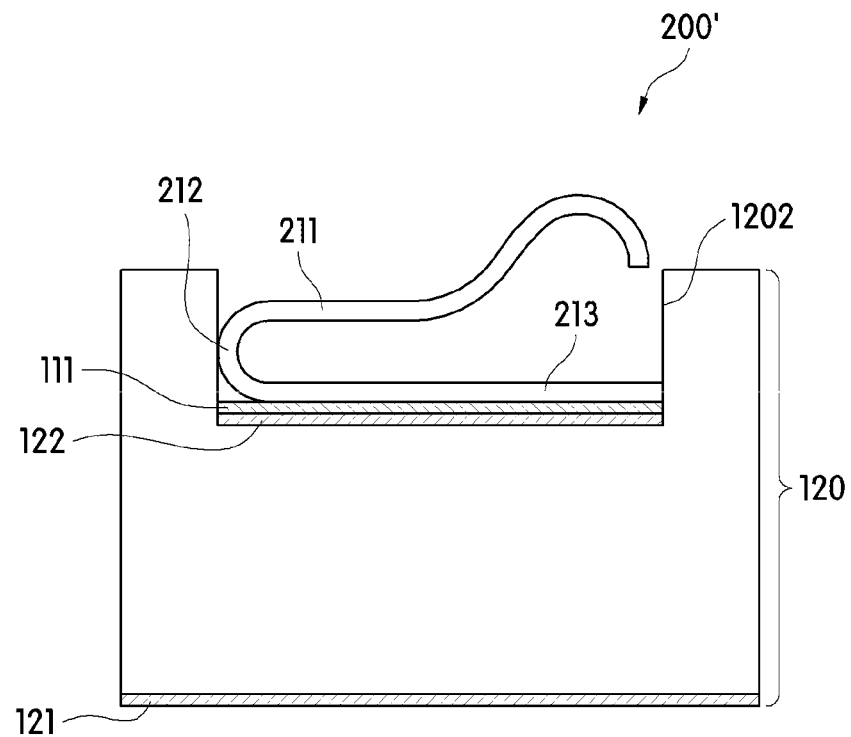
Figure 18:
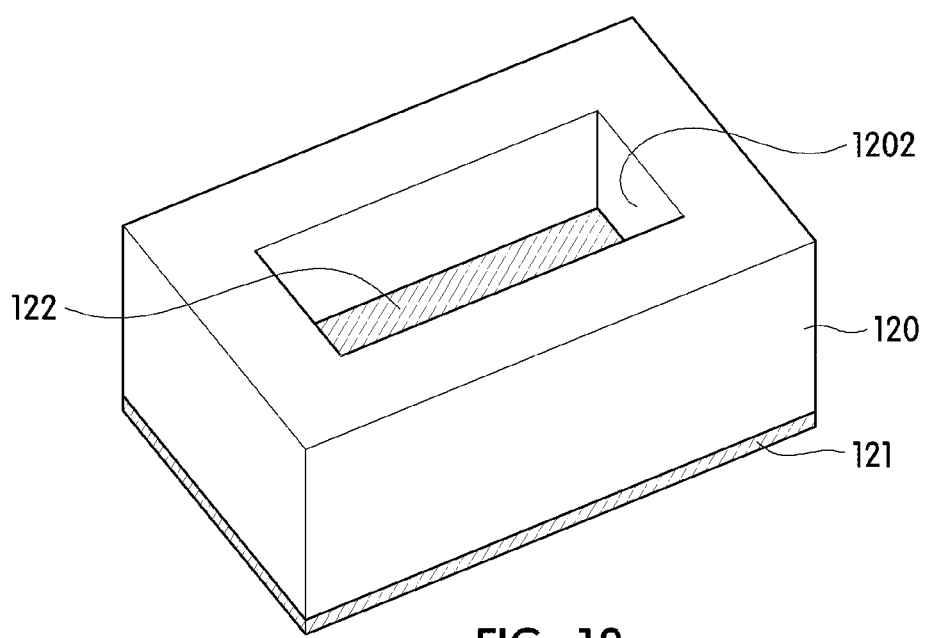
Figure 19:
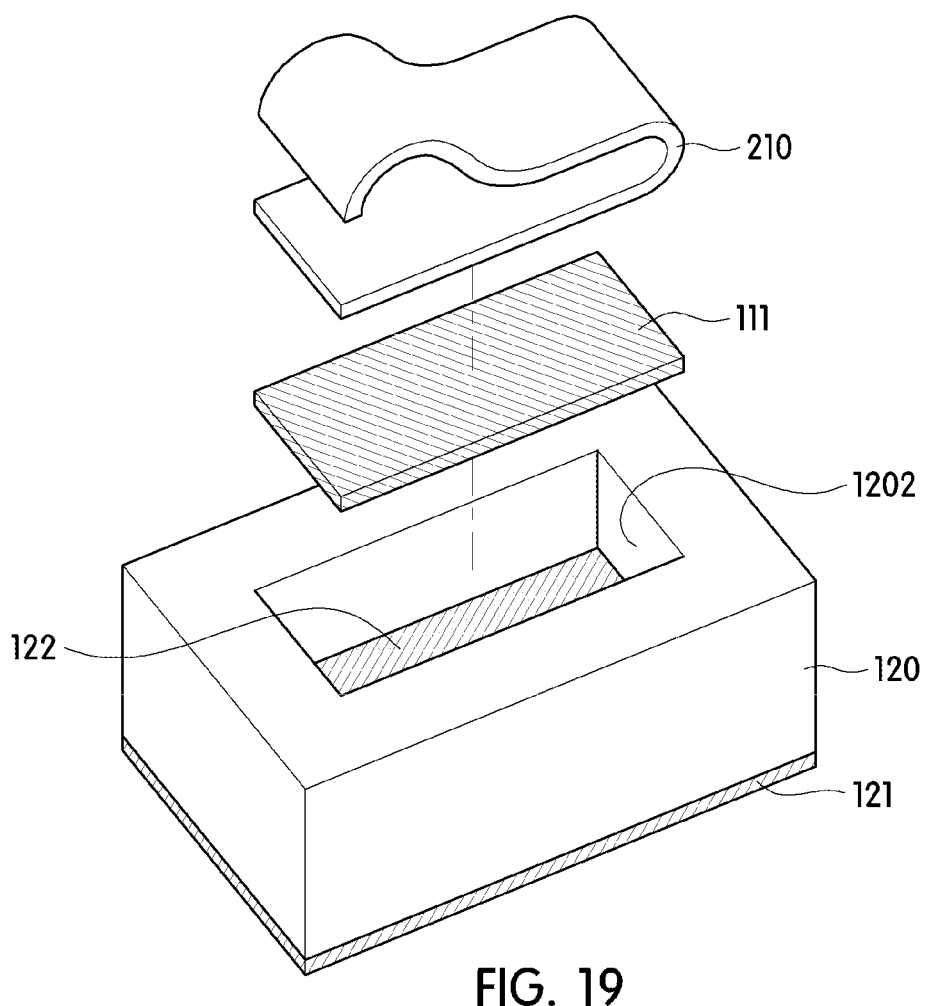

According to another embodiment, as illustrated in FIGS. 17 to 19, an electric shock protection element 120 may include a groove 1202 in a top surface thereof. Herein, a connection electrode 122 may be provided on a bottom surface of the groove 1202 of the electric shock protection element 120. In this case, at least a portion of the clip-shaped conductor 210 may be inserted and combined in the groove 1202 and may be fixed to a conductive adhesive layer 111.

Herein, although it has been described that the external electrode 121 and the connection electrode 122 are respectively formed on the bottom surface and the top surface of the electric shock protection element 120, the embodiment of the present invention is not limited thereto and the external electrode 121 and the connection electrode 122 may be provided on side surfaces of the electric shock protection element 120.

Since the groove 1202 may function as a side stopper due to the above-described structure, a separate side stopper may not be included in the clip-shaped conductor 210, and thus, manufacturing costs may be reduced. Also, since the at least a portion of the clip-shaped conductor 210 is inserted into the groove 1202, distortion or bending may be prevented after the combining and, in particular, falling or out of position in a reflow process after surface mounting (SMT) may be prevented.

Herein, although it has been shown and described that the electric shock protection element 120 is disposed under the clip-shaped conductor 210, the embodiment of the present invention is not limited thereto and the electric shock protection contactor 200 may have a structure in which the clip-shaped conductor 210 and the electric shock protection element 120 are electrically connected in series. For example, the electric shock protection element 120 may have a structure in which the electric shock protection element 120 is disposed horizontally to a terminal portion 213, and in this case, the terminal portion 213 may be configured so as not to contact with the circuit board 14.

Figure 20:
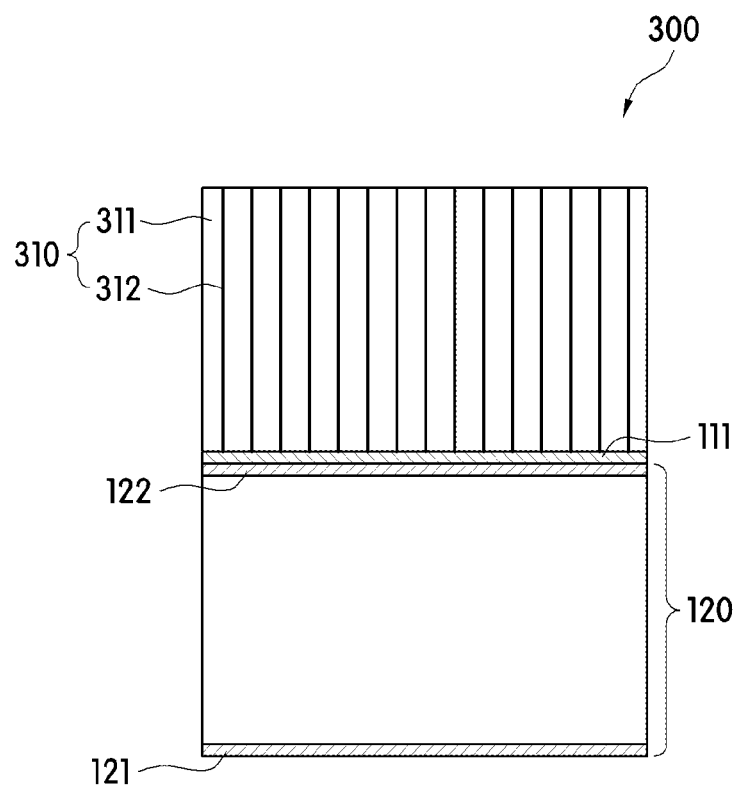
FIGS. 20 and 21 are cross-sectional views illustrating another example of the electric shock protection contactor according to the embodiment of the present invention.
Figure 21:
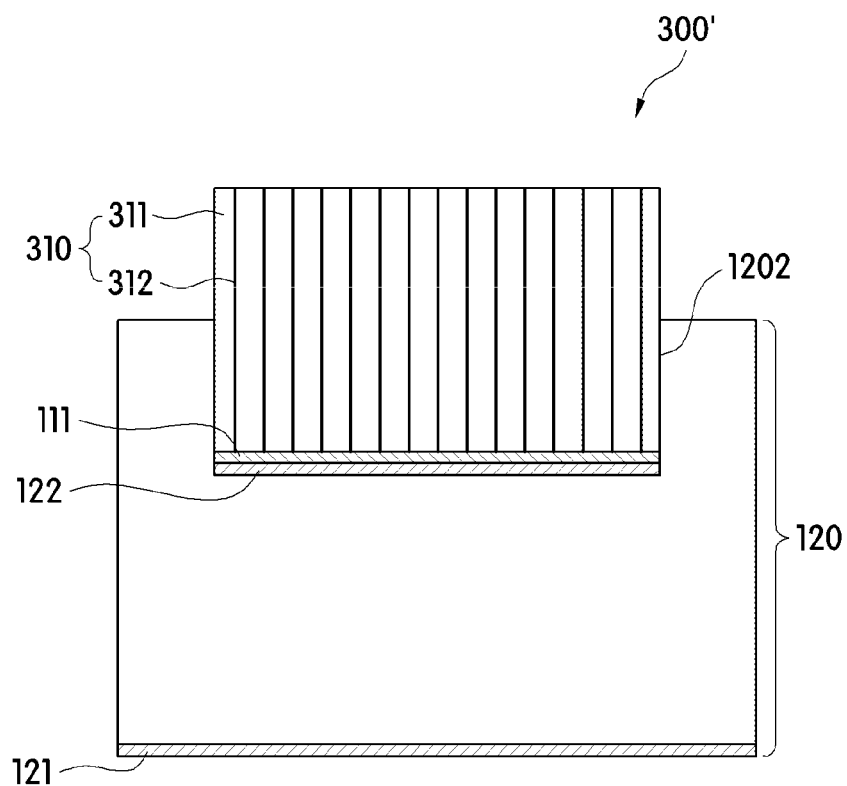

As illustrated in FIGS. 20 and 21, electric shock protection contactors 300 and 300' are cases in which a conductive connection unit is a silicon rubber pad 310, wherein the silicon rubber pad 310 includes a body 311 and a conductive wire 312.

The body 311 may be formed of a silicon rubber, the top thereof may be in surface contact with the conductor 12 such as an antenna or a metal housing, and the bottom thereof may be electrically connected to an electric shock protection element 120.

The conductive wire 312 may be vertically formed in the body 311. The conductive wire 312 is for supplementing the elastic force of the body 311 as well as improving electrical contact with the conductor 12.

For example, in a case in which the conductive wire 312 is pressed by the conductor 12, an upper end thereof may be bent downward, and in a case in which the conductor 12 is removed, the conductive wire 312 is restored to its original vertical state so that the elastic force of the body 311 may be supplemented.

Figure 22:
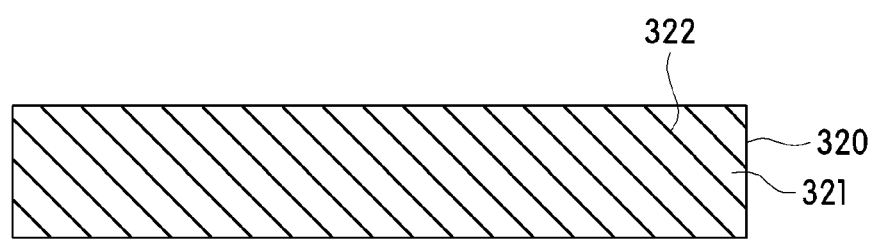
FIGS. 22 and 23 are cross-sectional views illustrating various configurations of a conductive connection unit of the electric shock protection contactor according to the embodiment of the present invention.

As illustrated in FIG. 22, the electric shock protection contactor is a case in which a conductive connection unit is a different type of silicon rubber pad 320, wherein the silicon rubber pad 320 includes a body 321 and a conductive wire 322.

The body 321 may be formed of a silicon rubber, the top thereof may be in surface contact with the conductor 12 such as an antenna or a metal housing, and the bottom thereof may be electrically connected to a suppressor 120.

The conductive wire 322 may be diagonally formed in the body 321. The conductive wire 322 is for supplementing the elastic force of the body 321 as well as improving electrical contact with the conductor 12.

For example, in a case in which the conductive wire 322 is pressed by the conductor 12, an upper end thereof may be tilted to right and left sides, and in a case in which the conductor 12 is removed, the conductive wire 322 is restored to its original vertical state so that the elastic force of the body 321 may be supplemented. In this case, when the conductive wire 322 is tilted by the pressing force of the conductor 12, the contact with the conductor 12 is improved and thus, the transmission of the communication signal may be improved.

Thus, the conductive wire 322 may have excellent transmission of the communication signal and good elastic restoring force and may be used for a long period of time in comparison to the vertically formed conductive wire 312 of FIG. 20 which is bent downward by the pressing force of the conductor 12.

Figure 23:
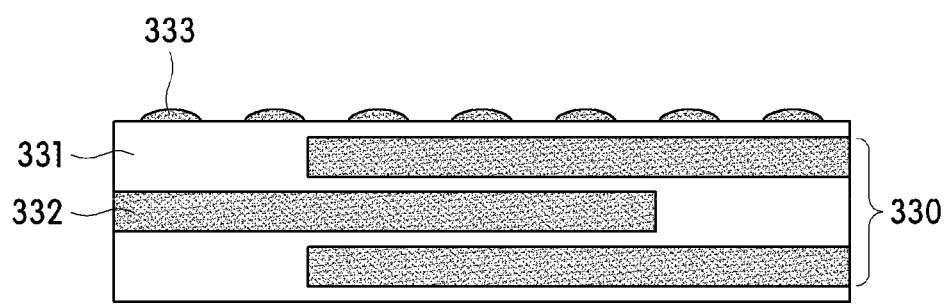

As illustrated in FIG. 23, the electric shock prevention contactor is a case in which a conductive connection unit is a silicon rubber pad 330, wherein the silicon rubber pad 330 includes a body 331, a conductive layer 332, and contact portions 333.

The body 331 may be formed of a silicon rubber, and the bottom thereof may be electrically connected to an electric shock protection element 120.

The conductive layer 332 may be horizontally alternately stacked in the body 331 and may be a plurality of layers formed of a curable Ag paste. The conductive layer 332 is for supplementing the elastic force of the body 331 as well as improving electrical contact with the conductor 12.

For example, in a case in which the conductive layer 332 is pressed by the conductor 12, the center portion thereof may be pressed downward, and in a case in which the conductor 12 is removed, the conductive layer 332 is restored to its original horizontal state so that the elastic force of the body 331 may be supplemented. Thus, the conductive layer 332 may have excellent elastic restoring force and may be used for a long period of time in comparison to the vertically formed conductive wire 312 of FIG. 20 which is bent downward by the pressing force of the conductor 12 or the diagonally formed conductive wire 322 of FIG. 22 which is tilted to the right and left sides.

The contact portions 333 may be formed in a curved protrusion shape on an upper side of the body 332. The contact portions 333 may increase a contact area with the conductor 12 by being in multiple line contact with or in surface contact with the conductor 12 such as an antenna or a metal housing. Thus, the silicon rubber pad 330 may improve the transmission of the communication signal.

The above-described electric shock protection contactor may be disposed on the conductor 12 contactable with the human body and the circuit board 14 in the portable electronic device. Herein, the electric shock protection contactor may be mounted on a mounting terminal of the circuit board 14.

According to the above-described configuration, the portable electronic device may protect the user from a leakage current of an external power source by blocking the leakage current of the external power source, which is introduced from the ground of the circuit unit 14, and may also protect an internal circuit from static electricity and obtain high capacitance by passing the static electricity without causing dielectric breakdown when the static electricity is introduced from the conductor 12 and passing the communication signal introduced from the conductor 12 without attenuation.

Since an electric shock protection contactor according to an embodiment of the present invention and a portable electronic device including the same may include an electric shock protection element in the contactor connecting a conductor and a circuit board in the portable electronic device in which the conductor, such as a metal case, is exposed to the outside, the user may be protected from a leakage current from an external power source.

According to the present invention, an internal circuit may be protected from static electricity.

According to the present invention, since high capacitance may be realized by adding a capacitor layer to the electric shock protection element of the electric shock protection contactor, a communication signal may be transmitted by minimizing the attenuation of the signal.

Also, according to the present invention, since the electric shock protection element and the contactor are integrally included, a separate element for implementing the corresponding function and an additional space of the element are not required, and thus, it may be suitable to minimize the portable electronic device.

Although specific embodiments of the present invention have been disclosed, those skilled in the art would understand that changes may be made for specific embodiments without departure from the spirit and scope of the present invention. Thus, the present invention is not limited to specific embodiments, and the attached claims comprise any and all of such applications, modifications and embodiments within the scope of the present invention.

What is claimed is:

1. An electric shock protection contactor comprising:
    a conductive connection unit having an elastic force electrically in contact with a conductor of an electronic device;
    a conductive adhesive layer; and
    an electric shock protection element connected to the conductive connection unit in series via the conductive adhesive layer and blocking a leakage current of an external power source that is introduced from ground of a circuit board of the electronic device,
    wherein the electric shock protection element has a breakdown voltage (Vbr) satisfying an equation below:

$$Vbr > Vin$$

where Vin is a rated voltage of the external power source of the electronic device,
    wherein the electric shock protection element comprises:
    a sintered body in which a plurality of sheet layers is stacked;
    at least one pair of internal electrodes spaced apart by a predetermined spacing in the sintered body; and
    a pore formed between the internal electrodes.

2. The electric shock protection contactor of claim 1, wherein the electric shock protection element comprises a groove in an upper side thereof, and
    at least a portion of the conductive connection unit is inserted into the groove.

3. The electric shock protection contactor of claim 1, wherein the electric shock protection element passes static electricity without causing dielectric breakdown when the static electricity is introduced from the conductor.

4. The electric shock protection contactor of claim 1, wherein the conductive connection unit is any one of a conductive gasket, a silicon rubber pad, and a clip-shaped conductor having an elastic force.

5. The electric shock protection contactor of claim 4, wherein the conductive gasket comprises at least one of a polymer body, a natural rubber, a sponge, a synthetic rubber, a heat-resistant silicon rubber, and a tube, prepared by thermal compression of a conductive paste.

6. The electric shock protection contactor of claim 4, wherein the silicon rubber pad comprises:
a body formed of a silicon rubber; and
a conductive wire vertically formed in the body.

7. The electric shock protection contactor of claim 4, wherein the silicon rubber pad comprises:
a body formed of a silicon rubber; and
a conductive wire diagonally formed in the body.

8. The electric shock protection contactor of claim 4, wherein the silicon rubber pad comprises:
a body formed of a silicon rubber;
a plurality of conductive layers horizontally alternately stacked in the body; and
a plurality of contact portions formed in a curved protrusion shape on an upper side of the body.

9. The electric shock protection contactor of claim 4, wherein the clip-shaped conductor comprises:
a contact portion having a curved shape and in contact with the conductor;
an extension portion extending from the contact portion and having an elastic force; and
a terminal portion electrically connected to the electric shock protection element.

10. The electric shock protection contactor of claim 2, wherein the electric shock protection element comprises an external electrode on a bottom surface of the groove, and
the conductive connection unit is stacked on the external electrode via a conductive adhesive layer.

11. The electric shock protection contactor of claim 1, wherein the pair of internal electrodes is disposed on the same plane.

12. The electric shock protection contactor of claim 1, wherein the pore comprises a discharging material layer that is coated on an inner wall along a height direction to a predetermined thickness.

13. An electric shock protection contactor comprising:
a conductive connection unit having an elastic force electrically in contact with a conductor of an electronic device; and
an electric shock protection element connected to the conductive connection unit in series via a conductive adhesive layer and blocking a leakage current of an external power source that is introduced from ground of a circuit board of the electronic device,
wherein the electric shock protection element has a breakdown voltage (Vbr) satisfying an equation below:

Vbr>Vin where Vin is a rated voltage of the external power source of the electronic device,
wherein the electric shock protection element comprises:
at least two varistor material layers in which a first varistor material layer and a second varistor material layer are alternately stacked;
a plurality of first internal electrodes spaced apart by a predetermined spacing (L) on the first varistor material layer; and
a plurality of second internal electrodes spaced apart by the predetermined spacing (L) on the second varistor material layer.

14. The electric shock protection contactor of claim 13, wherein each of the first internal electrode and the second internal electrode is disposed such that at least portions thereof overlap or do not overlap each other.

15. The electric shock protection contactor of claim 13, wherein the spacing (L) between the first internal electrodes or the second internal electrodes is greater than a sum of a shortest distance (d1) between the first internal electrode and the second internal electrode and a shortest distance (d2) between the other neighboring first internal electrode and the second internal electrode.

16. An electric shock protection contactor comprising:
a conductive connection unit having an elastic force electrically in contact with a conductor of an electronic device; and
an electric shock protection element connected to the conductive connection unit in series via a conductive adhesive layer and blocking a leakage current of an external power source that is introduced from ground of a circuit board of the electronic device,
wherein the electric shock protection element passes a communication signal introduced from the conductor;
the electric shock protection element comprises an electric shock protection unit and at least one capacitor layer; and
the electric shock protection unit has a breakdown voltage (Vbr) satisfying an equation below:

Vbr>Vin, Vcp>Vbr where Vin is a rated voltage of the external power source of the electronic device, and
Vcp is a dielectric breakdown voltage of the capacitor layer.

17. The electric shock protection contactor of claim 16, wherein the capacitor layer is electrically connected to the electric shock protection unit in parallel.

18. The electric shock protection contactor of claim 16, wherein a spacing between the capacitor layer and the electric shock protection unit is greater than a spacing between a pair of internal electrodes of the electric shock protection unit.

19. The electric shock protection contactor of claim 16, wherein the electric shock protection element comprises:
a sintered body in which a plurality of sheet layers is stacked;
an electric shock protection unit including at least one pair of internal electrodes spaced apart by a predetermined spacing in the sintered body and a pore formed between the internal electrodes; and
at least one stacked capacitor layer passing the communication signal.

20. The electric shock protection contactor of claim 19, wherein the pair of internal electrodes is disposed on the same plane.

21. The electric shock protection contactor of claim 19, wherein the pore comprises a discharging material layer that is coated on the inner wall along a height direction to a predetermined thickness.

22. The electric shock protection contactor of claim 16, wherein the electric shock protection element comprises:

an electric shock protection unit comprising at least two varistor material layers in which a first varistor material layer and a second varistor material layer are alternately stacked, a plurality of first internal electrodes spaced apart by a predetermined spacing (L) on the first varistor material layer, and a plurality of second internal electrodes spaced apart by the predetermined spacing (L) on the second varistor material layer; and at least one stacked capacitor layer passing the communication signal.

23. The electric shock protection contactor of claim 22, wherein the breakdown voltage (Vbr) is a sum of breakdown voltages respectively formed between the nearest first internal electrode and second internal electrode.

24. The electric shock protection contactor of claim 22, wherein each of the first internal electrode and the second internal electrode is disposed such that at least portions thereof overlap or do not overlap each other.

25. The electric shock protection contactor of claim 22, wherein the spacing (L) between the first internal electrodes or the second internal electrodes is greater than a sum of a shortest distance (d1) between the first internal electrode and the second internal electrode and a shortest distance (d2) between the other neighboring first internal electrode and the second internal electrode.

26. A portable electronic device comprising:

a conductor contactable with a human body;

a circuit board in which a plurality of passive elements and a plurality of active elements are installed;

a conductive adhesive layer; and an electric shock protection contactor having one end electrically connected to the circuit board and another end electrically connected to the conductor in series, wherein the electric shock protection contactor comprises:

a conductive connection unit having an elastic force electrically in contact with a conductor; and an electric shock protection element connected to the conductive connection unit in series via the conductive adhesive layer and blocking a leakage current of an external power source that is introduced from ground of the circuit board.

27. The portable electronic device of claim 26, wherein the conductor comprises at least one of an antenna for communication between the electronic device and an external device, a metal case, and conductive accessories.

* * * * *